United States Patent
Keidar et al.

(10) Patent No.: US 11,126,278 B2
(45) Date of Patent: Sep. 21, 2021

(54) STYLUS WITH LIGHT ENERGY HARVESTING

(71) Applicant: Microsoft Technology Licensing, LLC, Redmond, WA (US)

(72) Inventors: Itay Keidar, Kfar-Saba (IL); Benjamin Imanilov, Hod-HaSharon (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 417 days.

(21) Appl. No.: 15/371,240

(22) Filed: Dec. 7, 2016

(65) Prior Publication Data

US 2018/0157347 A1    Jun. 7, 2018

(51) Int. Cl.
*G06F 3/0354* (2013.01)
*G06F 3/038* (2013.01)
*H01L 31/053* (2014.01)

(52) U.S. Cl.
CPC ........ *G06F 3/03545* (2013.01); *G06F 3/0383* (2013.01); *G06F 3/0386* (2013.01); *H01L 31/053* (2014.12)

(58) Field of Classification Search
CPC ................ H04J 14/0246; G06F 3/0488; G06F 3/03545; G06F 3/0386; G06F 3/0383; H01L 31/053
See application file for complete search history.

(56) References Cited

U.S. PATENT DOCUMENTS

| | | | |
|---|---|---|---|
| 4,490,607 A | 12/1984 | Pease et al. | |
| 4,726,044 A | 2/1988 | Perna et al. | |
| 6,172,668 B1 | 1/2001 | Baur | |
| 6,377,249 B1 | 4/2002 | Mumford | |
| 7,273,174 B2 | 9/2007 | Chinag et al. | |
| 7,773,076 B2 | 8/2010 | Pittel et al. | |
| 8,621,245 B2 | 12/2013 | Schearer et al. | |

(Continued)

FOREIGN PATENT DOCUMENTS

| | | |
|---|---|---|
| EP | 2136409 | 12/2009 |
| JP | 2009-240086 | 10/2009 |

OTHER PUBLICATIONS

Chu et al. "Bulk Photovoltaic Effect for the Linearly Polarized Light in Pb(Zn1/3Nb2/3)O3 Single Crystals", Japanese Journal of Applied Physics, 34(Part 1/2A): 527-529, Feb. 1995.

(Continued)

*Primary Examiner* — Abbas I Abdulselam (57) ABSTRACT

A stylus includes a housing extending over a length and including a first end opposite a second end, a circuit configured to generate a signal, a power source configured to power generation of the signal, a writing tip extending from the first end of the housing, and a light harvesting unit configured to generate energy. The light harvesting unit includes a transparent window integral with the housing and positioned proximal to the writing tip, a panel of solar cells configured to absorb light received through the transparent window, optical fibers configured to transmit light from the window toward the panel of solar cells and an optical diffuser configured to diffuse the light transmitted by the optical fibers over a spatial extent of the panel of solar cells. The energy generated by the light harvesting unit is received by the circuit and configured to recharge the power source.

20 Claims, 8 Drawing Sheets

(56) References Cited

U.S. PATENT DOCUMENTS

| | | | |
|---|---|---|---|
| 8,872,792 B2 | 10/2014 | Bakken et al. | |
| 9,081,569 B2 | 7/2015 | Mercea et al. | |
| 2004/0008411 A1* | 1/2004 | Freese | G02B 5/1885 |
| | | | 359/460 |
| 2004/0135765 A1* | 7/2004 | Kinerk | G06F 1/1626 |
| | | | 345/156 |
| 2008/0231613 A1 | 9/2008 | Tsai | |
| 2008/0307144 A1* | 12/2008 | Minoo | G06F 1/1632 |
| | | | 710/304 |
| 2011/0090702 A1 | 4/2011 | Ho et al. | |
| 2011/0209749 A1* | 9/2011 | Yang | G06F 3/041 |
| | | | 136/255 |
| 2015/0054796 A1* | 2/2015 | Kuo | G06F 3/03545 |
| | | | 345/179 |
| 2015/0167934 A1* | 6/2015 | Noeth | F21V 14/04 |
| | | | 362/259 |
| 2015/0338066 A1 | 11/2015 | Al-Saud et al. | |
| 2016/0154484 A1 | 6/2016 | Kampf | |

OTHER PUBLICATIONS

DisplayMate "Light Spectra for the Microsoft Surface Pro 3", DisplayMate® Technologies Corporation, 1 P., 2014.
DisplayMate "Light Spectra for the Microsoft Surface Pro 4", DisplayMate® Technologies Corporation, 1 P., 2015.
Phys Org News "Researchers Develop LED Covering Full Visible Light Spectrum", Phys Org News, p. 1-8, Apr. 14, 2016.
Riyaz "Energy Harvesting From Your Phone Display", Science-Shock Blogspot, 2 P., Oct. 27, 2012.
Zheludev "Photonic Plasmonic Devices: A 7-nm Light Pen Makes Its Mark", Nature Nanotechnology, 5(1): 10-11, Jan. 2010.
International Search Report and the Written Opinion dated Feb. 19, 2018 From the International Searching Authority Re. Application No. PCT/US2017/064389. (17 Pages).

* cited by examiner

STYLUS WITH LIGHT ENERGY HARVESTING

FIELD AND BACKGROUND OF THE INVENTION

Signal emitting styluses such as active styluses, are known in the art for use with a digitizer system. An active stylus typically includes a battery to power generation and transmission of the signals emitted by the stylus. Positions of the stylus provide inputs to a computing device associated with the digitizer system and are interpreted as user commands. Often, the digitizer system is integrated with a display screen of the computing device to form a touchscreen.

SUMMARY OF THE INVENTION

The disclosure in some embodiments relates to a stylus configured to harvest energy from light emitted by an electronic display of a touch screen. The stylus collects the light during interaction with the touch screen, while the stylus is in close proximity to the touch screen, e.g. 0-10 cm, 0-5 cm or 0-2 cm from the touch screen. The energy harvested may recharge a power source of the stylus or directly power an operation of the stylus.

According to embodiments of the disclosure, a light harvesting unit in the stylus includes a light receiving window that is directed toward the touch screen and is configured to collect light in a wavelength typically emitted by the touch screen. Optionally, the light harvesting unit is also configured to operate with intensity of light that is emitted by the touch screen. Due to the close proximity of the stylus to the touch screen during harvesting, the intensity of light that is collected from the electronic display is significantly higher than intensity from ambient lighting in a room or from outdoor lighting. The higher intensity light may lead to harvesting at a faster rate.

In some additional example embodiments, a computing device or docking station includes a light emitting diode (LED) that provides light that can be harvested by the stylus while the stylus is stored with its light receiving window generally aligned with the LED.

Unless otherwise defined, all technical and/or scientific terms used herein have the same meaning as commonly understood by one of ordinary skill in the art. Although methods and materials similar or equivalent to those described herein can be used in the practice or testing of embodiments of the disclosure, example methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some implementations are herein described, by way of example only, with reference to the accompanying drawings. With specific reference now to the drawings in detail, it is stressed that the particulars shown are by way of example and for purposes of illustrative discussion of embodiments of the disclosure. In this regard, the description taken with the drawings makes apparent to those skilled in the art how embodiments of the disclosure may be practiced.

In the drawings.

DESCRIPTION OF SPECIFIC EMBODIMENTS OF THE INVENTION

According to some example implementations, a stylus includes a light harvesting unit configured to harvest light from a touch screen while a user is using the stylus to interact with the touch screen. The light harvesting unit may also be configured to harvest light from a Light Emitting Diode (LED) positioned near a writing tip of the stylus while the stylus is in an idle state as when the stylus is being stored.

According to some example implementations, the light harvesting unit includes a light capturing area near a writing tip of the stylus and optical fibers that transmit the captured light to an area of the stylus that includes a panel of solar cells, e.g., a panel of photovoltaic cells or other elements for converting the light to energy. The panel of solar cells is spread over an area on the stylus that is remote from the writing tip and not fully occupied with circuitry, e.g. a back end of the stylus. The optical fibers may run along a length of the stylus toward the panel of solar cells, e.g. toward a back end of the stylus. Optionally, the panel of solar cells (or other light to energy converting element) is specifically configured to harvest energy from light emitted by a touch screen. Efficiency of the panel may be improved by selecting or configuring a panel to collect light in a wavelength emitted by the touch screen. Touch screens are known to illuminate with an LED backlight. In some implementations, the panel of photovoltaic cells (or other light to energy converting element) is specifically configured to harvest energy from white LED light. Although a touch screen typically has a multicolor display, an area of interaction with the stylus is predominantly white.

The number of solar cells in the panel may be selected based on a rate at which the solar cells can absorb light and based on the intensity of light that can be collected from the touch screen. By projecting the light over a plurality of solar cells as opposed to a single cell, the rate at which light can be absorbed and thereby the rate at which energy can be harvested may be increased.

According to some implementations, the panel of solar cells is positioned on an inner wall of the stylus housing. Since the stylus housing is circumferential with a circular cross section, the panel of solar cells may be selected to be flexible to accommodate positioning the panel on the curved surface of the housing. Optionally, the panel covers the entire circumference of the housing to accommodate a plurality of solar cells that can simultaneously absorb light transmitted by the optical fibers. In some implementations, the light harvesting unit additionally includes an optical diffuser connected to an output of the optical fibers to diffuse the light across most or all of the solar cells in the panel. By diffusing the light, the number of solar cells that can simultaneously receive input from the optical fibers increases and the rate of the energy harvested may also increase. The harvesting efficiency may be increased by spreading the relatively high intensity light from the touch screen over a plurality of solar cells.

In some alternative implementations, the stylus includes a housing and a shell that encompasses the housing and forms a hollow between the housing and the shell. The shell may include the light capturing area near the writing tip of the stylus and the outer surface of the housing encompassed by the shell may include the flexible panel of solar cells. The panel of solar cells is electrically connected to circuitry in the housing by wired connection, e.g. through a bore formed in the housing. Optionally, reflective material is included in the inner wall of the shell to reflect light entering into the cavity between the housing and the shell. Light entering through the window of the shell is trapped in the hollow between the shell and the housing and is then absorbed by the panel of solar cells positioned on the housing.

In some implementations, a stylus may also harvest energy while stored in an idle state. In an example, an LED is included near an area where a stylus may be stored and the stylus harvests energy from the LED during storage. For example, when a stylus is configured to be stored along an edge of a tablet, an LED is positioned on a frame of the tablet and directed to emit light in a direction toward where a writing tip would be positioned. In some additional implementations, a dedicated docking station for holding a stylus in an idle state may include an LED that directs light toward the writing tip of the stylus while it is in the docking station. Light harvesting unit in the stylus collects the light from the LED and harvests the energy to recharge a battery or other power source in the stylus. In some implementations, a sensor may activate the LED upon sensing a presence of the stylus.

Figure 1:
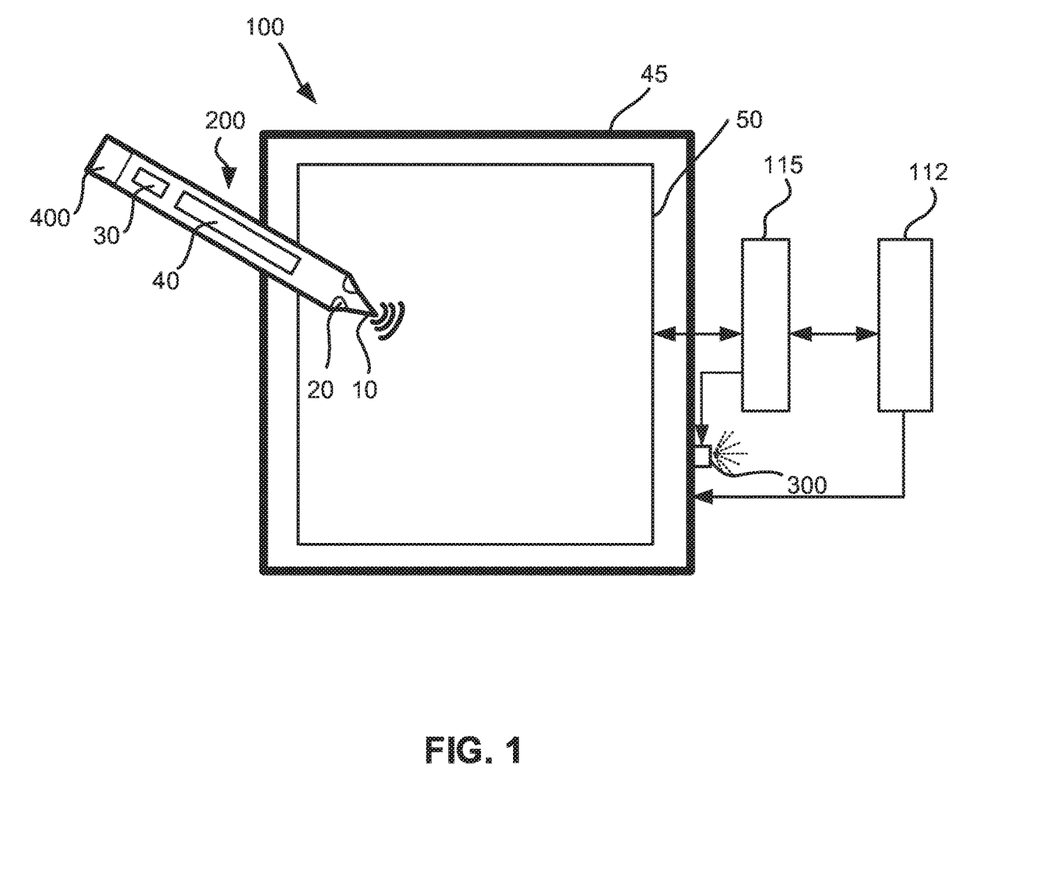
FIG. 1 is a simplified block diagram of an example computing device.

Reference is now made to FIG. 1 showing a simplified block diagram of an example computing device. A computing device 100 includes a display 45 integrated with a digitizer sensor 50. In some example implementations, display 45 is a flat panel display. Display 45 may include an LED backlight. Digitizer sensor 50 may be a grid based capacitive sensor or other sensor that is configured to detect input by stylus 200 transmitting an electromagnetic signal via its writing tip 10. Circuit 115 electrically connected to digitizer sensor 50 manages and controls stylus based detection. Optionally, circuit 115, performs synchronization with stylus 200, process signals received by stylus 200, and tracks coordinates of stylus 200. Output from circuit 115 may be reported to host 112.

Circuit 40 of stylus 200 generates the electromagnetic signal and a battery or super capacitor 30 powers the generation. Stylus 200 includes light harvesting unit 400 that harnesses light emitted from display 45 to recharge battery 30 or to power operation of circuit 40. The light harnessing unit includes one or more windows 20 facing display 45 through which light from display 45 penetrates into stylus 200, a panel of solar cells that are configured to absorb light received through windows 20.

Optionally, stylus 200 operates by periodically transmitting a beacon signal and may also periodically transmit other information directly related to stylus 200, related to an environment around the stylus 200, to a user using stylus 200, to privileges allotted to the stylus 200, capabilities of stylus 200, or information received from a third-party device. Processing and transmission from stylus 200 may be power assisted with light harvesting unit 400. Optionally, other handheld devices configured to interact with digitizer sensor 50 may be operated in a manner similar to stylus 200 and may include light harvesting unit 400.

In some implementations, computing device 100 additionally includes an LED 300 for charging battery 30 with light harvesting unit 400 while stationing stylus 200 in an idle state on a frame around display 45. LED 300 may be positioned on a frame around display 45 at a location that is generally aligned with window 20 when stylus 200 is stationed on the frame.

Figures 2A, 2B:
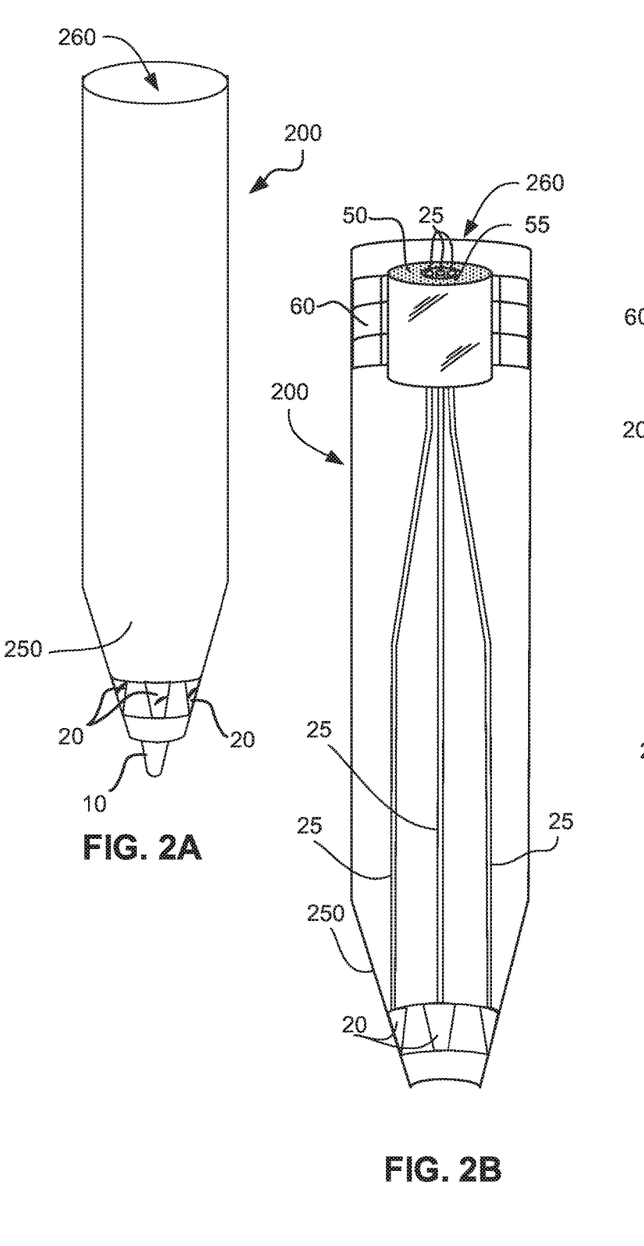
FIGS. 2A, 2B and 2C are simplified schematic views of an example stylus including a light harvesting unit.
Figure 2C:
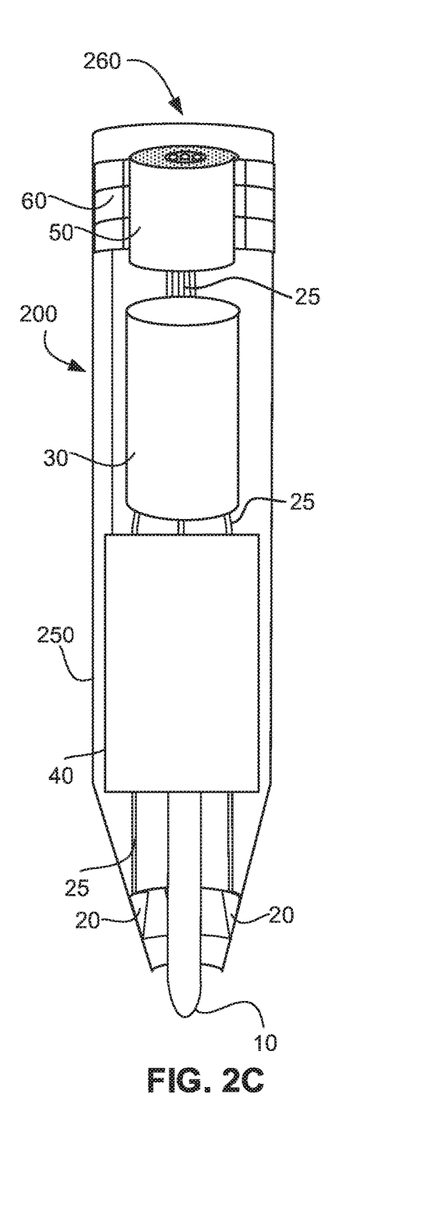

Reference is now made to FIGS. 2A, 2B and 2C showing simplified schematic views of an example stylus including a light harvesting unit. A light harvesting unit for stylus 200 includes a plurality of windows 20 from which light is received, optical fibers 25 for transmitting the light from each of windows 20 to an optical diffuser 50, the optical diffuser that diffuses the light transmitted by optical fibers 25 over substantially the entire panel of solar cells 60. Solar cells 60 are electrically connected to a DC-DC converter and optionally an energy management unit both of which are included in circuit 40 for converting and managing the energy harvested for recharging battery 30 or for powering operations of circuit 40. The light harvesting unit may include the DC-DC converter.

A plurality of windows 20 are positioned around a diameter of stylus 200 in proximity to writing tip 10 and are integrated as part of housing 250. Windows 20 are transparent and may include optical properties that focus the light into optical fibers 25. Optical fibers 25 are fixed to windows 20 and extend along a length of housing 250 toward a volume in the housing that is displaced from circuit 40 and battery 30. Optionally, optical fibers 25 extend toward a back end 260 of the stylus opposite the end including writing tip 10. Optical fibers 25 may extend past a volume of housing 250 occupied by circuit 40 and battery 30 to an area that can accommodate projecting the received light over a plurality of solar cells 60. Back end 260 may be configured to have enough room to spread the panel of solar cells 60 and position optical diffuser 60.

According to some implementations, optical diffuser 50 is positioned to face panel 60 and output from optical fibers 25 is transmitted through optical diffuser 50. In some examples, optical diffuser 50 is cylindrical in shape and diffuses light from optical fibers over 360 degrees. An upper and lower surface of optical diffuser 50 may be coated with reflective material so that the light is only projected through a surface of optical diffuser 50 that faces solar cells 60. Additional portions of optical diffuser 60 may also be coated with reflective material. Optical fibers may be connected to optical diffuser 50 through a bore 55 formed in optical diffuser. Bore 55 is shown as a through-going bore for illustrative purposes but may be a blind hole.

In some example implementations, panel of solar cells 60 may be positioned on an inner wall of housing 250 so that light emitted from optical diffuser 50 is directed on solar cells 60. The panel of solar cells 60 may be flexible to accommodates positioning the panel on curved surface of housing 250. Optionally, panel of solar cells 60 covers an entire circumference of housing 250, e.g., is spread over 360 degrees. Panel of solar cells 60 is placed distal from writing tip 10 in an area of housing 250 that can accommodate a plurality of cells, e.g., maximum number of cells. In some implementations, a rate at which energy is harvested is increased by spreading the received light over a plurality of solar cells 60. Transmitting the light to an area in the stylus that can accommodate more solar cells facilitates increasing the energy harvesting rate.

Figure 3A:
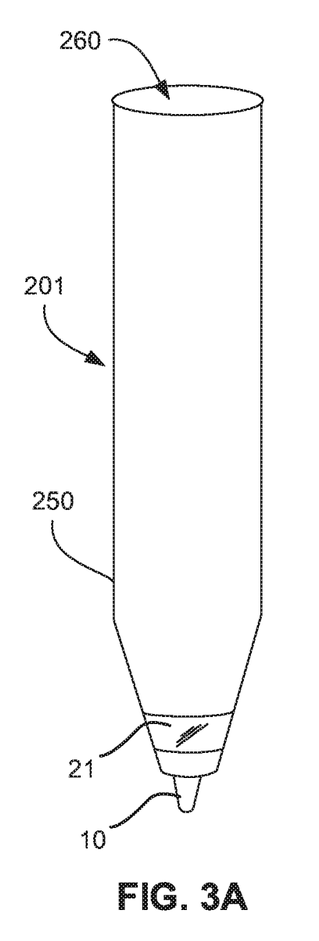
FIGS. 3A and 3B are simplified schematic views of another example stylus including a light harvesting unit.
Figure 3B:
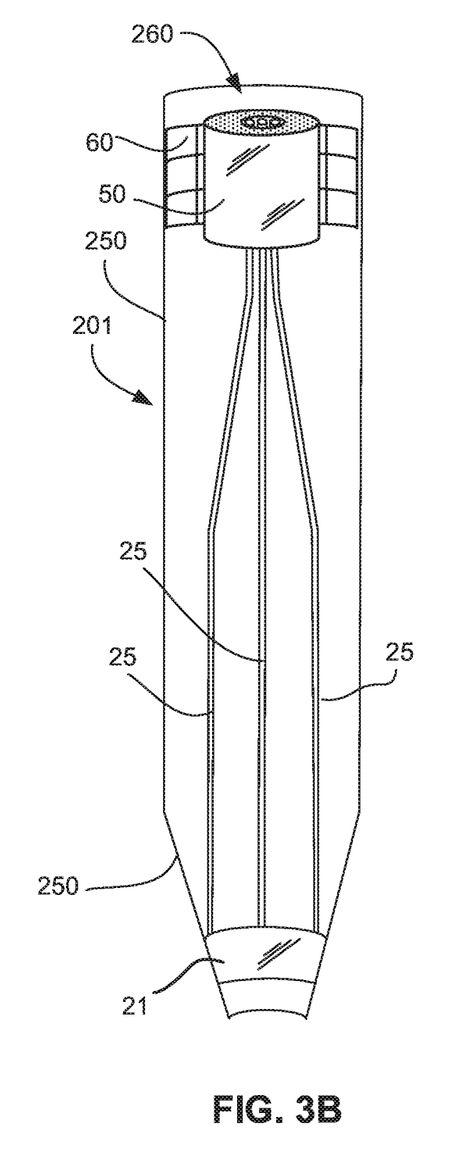

Reference is now made to FIGS. 3A and 3B showing simplified schematic views of an example stylus including a light harvesting unit in accordance with some example implementations of the disclosure. In an example implementation, a stylus 201 includes a light harvesting unit with a single ring shaped window 21 in place of the plurality of windows 20 shown in FIGS. 2A-2C. Circuitry 40 and battery 30 are not shown for simplicity purposes. Window 21 is transparent and may have optical properties for focusing the received light. In some example implementations, a plurality of optical fibers 25 are attached from within housing 250 to window 21 along a circumference of window 250. Window 21 is integral to housing 250 or connected to housing 250. Optical fibers 25, optical diffuser 50 and solar cells 60 operate in a same manner as described in reference to FIGS. 2A-2C.

Figure 4A:
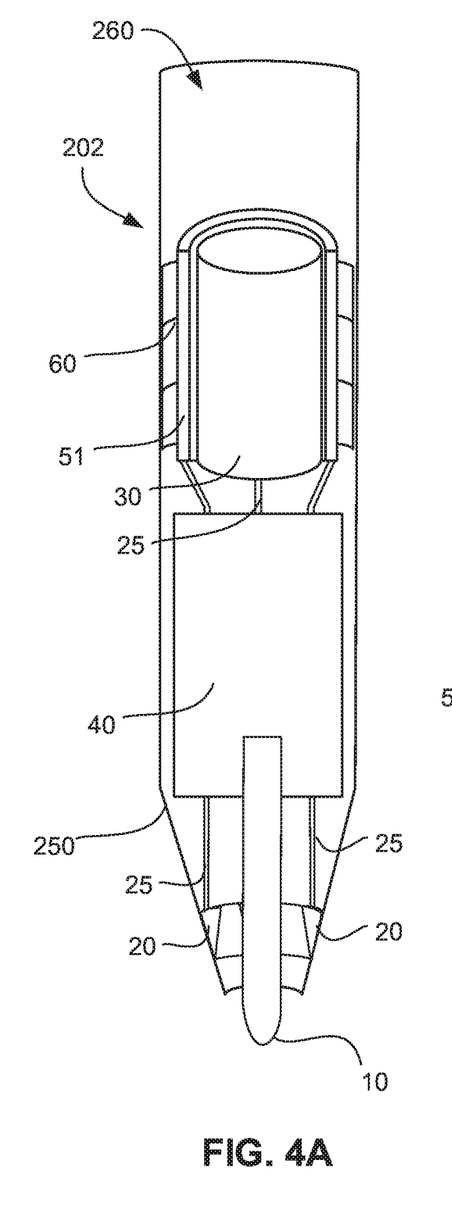
FIGS. 4A and 4B are simplified schematic view of an example stylus including a ring shaped optical diffuser and an example ring shaped optical diffuser respectively.
Figure 4B:
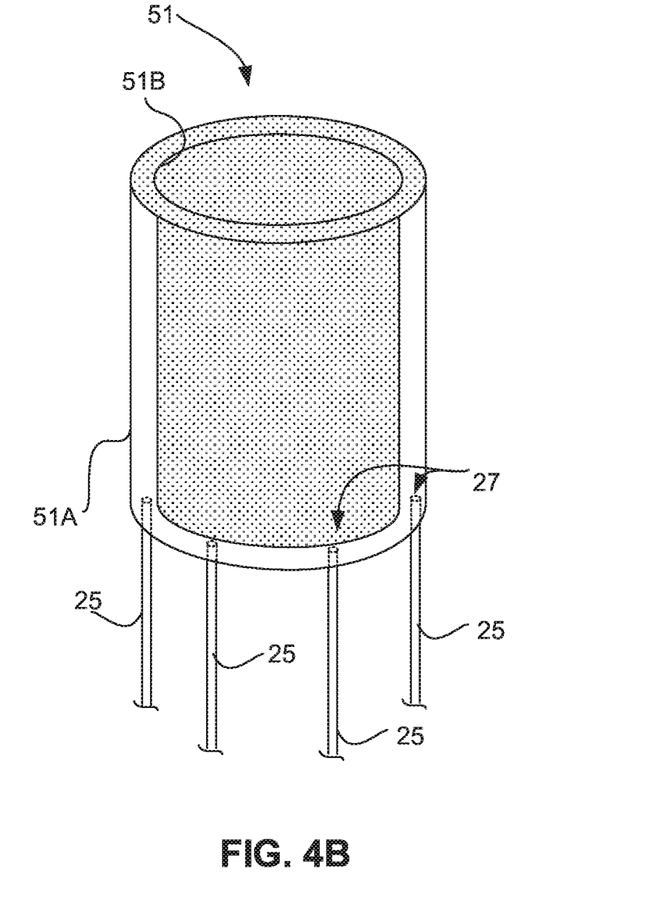

Reference is now made to FIGS. 4A and 4B showing a simplified schematic view of an example stylus including a ring shaped optical diffuser and an example ring shaped optical diffuser respectively. In some implementations, a more compact construction of a stylus 202 may be achieved by placing solar cells 60 at a same height as battery 30 and fitting a ring shaped optical diffuser 51 around battery 30. A diffuser inner surface 51B facing battery 30 may be coated with reflective material so that the light penetrating into optical diffuser 51 may be projected in a direction toward solar cells 60. Optical fibers 25 may be connected to optical diffuser 51 through holes 27 introduced through a thickness of the ring. Although optical diffuser 51 is shown to have a height similar to that of battery 30, a height of optical diffuser 51 may be defined to match dimensions of the panel of solar cells 60 and may be shorter or longer than battery 30.

Figure 5A:
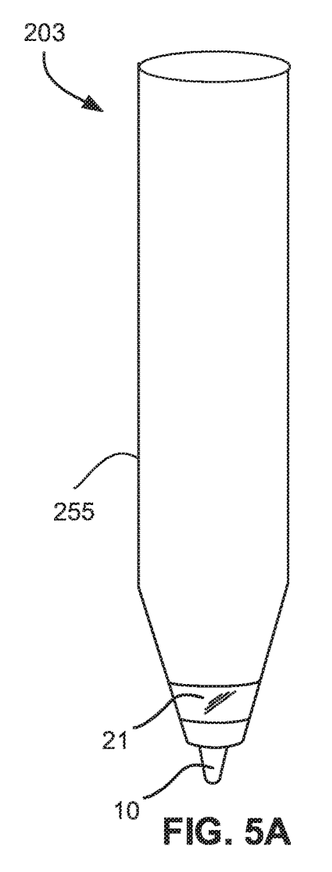
FIGS. 5A and 5B are simplified schematic views of an example stylus including a shell encompassing a housing of the stylus.
Figure 5B:
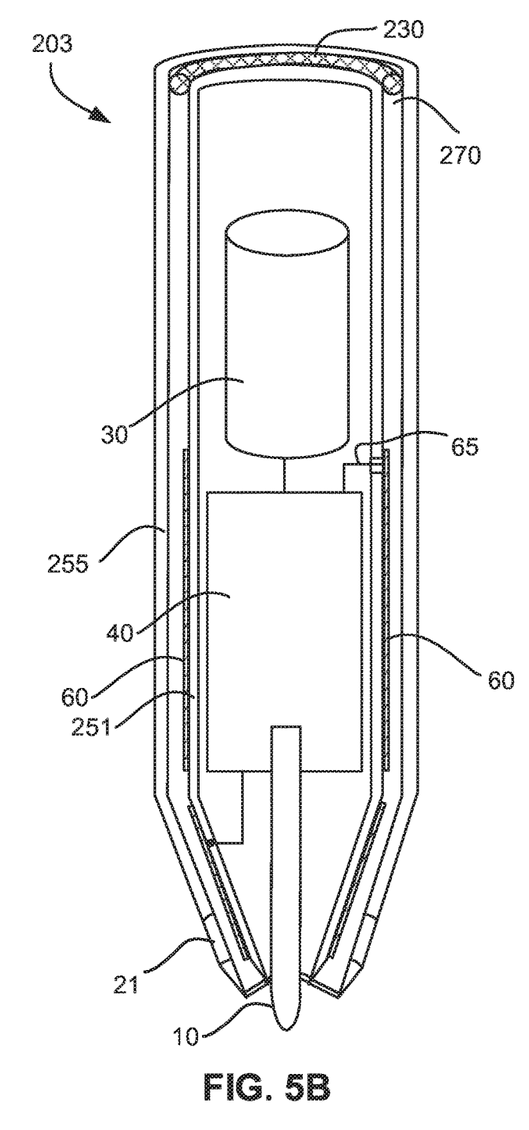
Figure 6A:
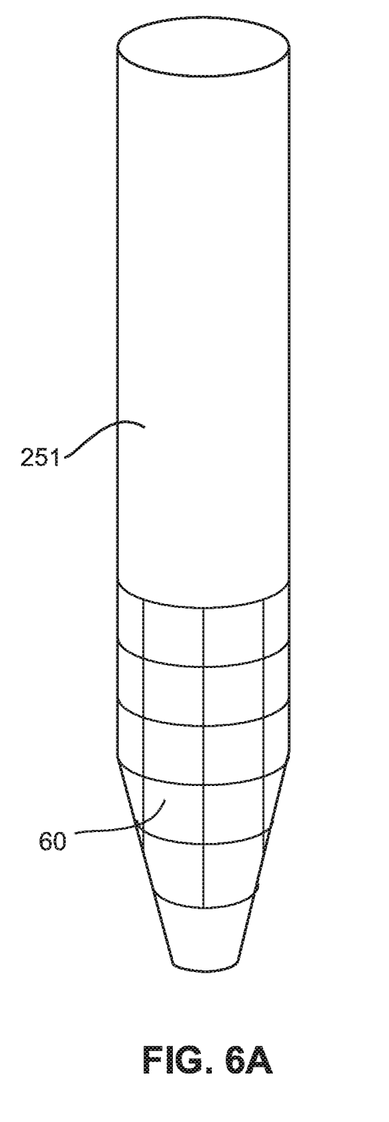
FIGS. 6A and 6B are simplified schematic views of outer surfaces of example housing and surrounding shell of a stylus.
Figure 6B:
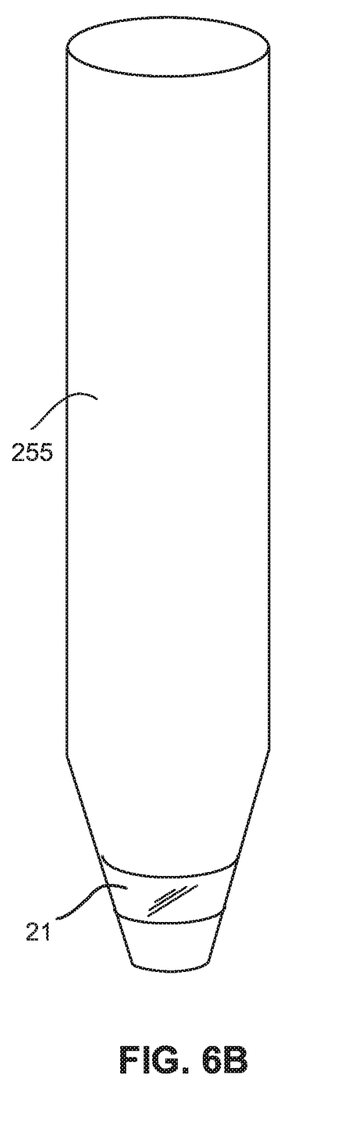

Reference is now made to FIGS. 5A and 5B showing simplified schematic views of an example stylus including a shell encompassing a housing of the stylus and to FIGS. 6A and 6B showing simplified schematic views of outer surfaces of the example housing and the surrounding shell. In some examples, a stylus 203 is formed with a shell 255 surrounding a housing 251 with a defined space 270 between them. Shell 255 may be secured around housing 251 with an O-ring 230. Housing 251 houses circuit 40 and battery 30. Writing tip 10 may also extend out from housing 251.

In another example, shell 255 includes window 21 in the vicinity of writing tip 10 and panel of solar cells 60 is positioned around an outer surface of housing 251 (FIG. 6A). Light penetrating through window 21 enters into space 270 (FIG. 5B) and is absorbed by solar cells 60. Solar cells 60 may face window 21 and/or may be displaced from window 21. Optionally, an interior wall of shell 255, e.g., wall facing housing 251 is coated or formed with reflective material to improve collection of light toward solar cells 60. Solar cells 60 may be connected to circuit 40 housed in housing 251 with wired connection through a hole formed in housing 251.

Figure 7:
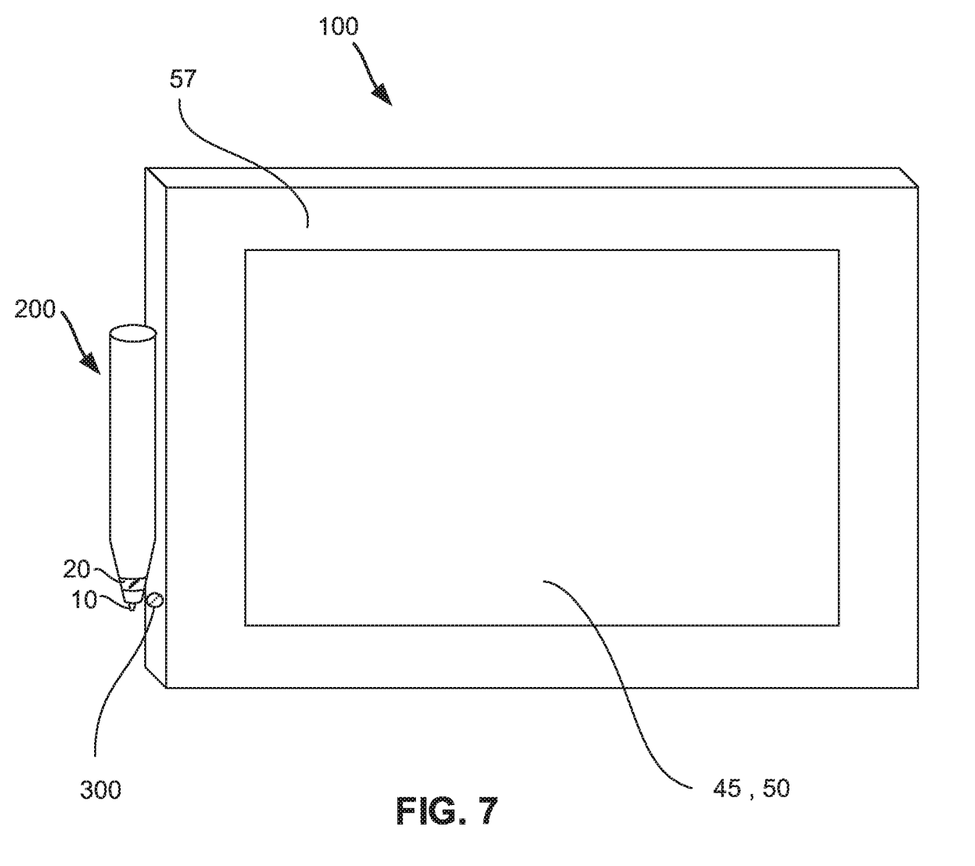
FIG. 7 is a simplified schematic drawing of a dedicated Light Emitting Diode (LED) on a touch screen that is configured for charging a stylus.

Reference is now made to FIG. 7 showing a simplified schematic drawing of a dedicated Light Emitting Diode (LED) on a touch screen that is configured for charging. According to some implementations, light harvesting may also be implemented during an idle state of stylus 200, e.g., while the stylus is not being used for interacting with the touch screen. For example, while stylus 200 is attached or positioned on a frame 57 around display 45 with digitizer sensor 50, a LED 300 positioned on frame 57 may provide illumination for harvesting energy in stylus 200. Stylus 200 may be configured to be removably attached to frame 57 by magnetic connection and LED 300 is positioned in an area that generally aligns with position of writing tip 10 and window 20. More than one LED 300 may be positioned on frame 57 to cover optionally areas that may be aligned with window 20. LED 300 may optionally be activated in response to sensing presence of stylus 200 on frame 57 or in response to sensing an idle state of stylus 200. LED 300 may be selected to emit light in a range that corresponds to sensitivity of solar cells 60 in stylus 200. LED 300 may be located inside a stylus garage integrated within frame 57 and LED 300 may be activated in response to sensing presence of stylus 200 in the garage.

Figure 8A:
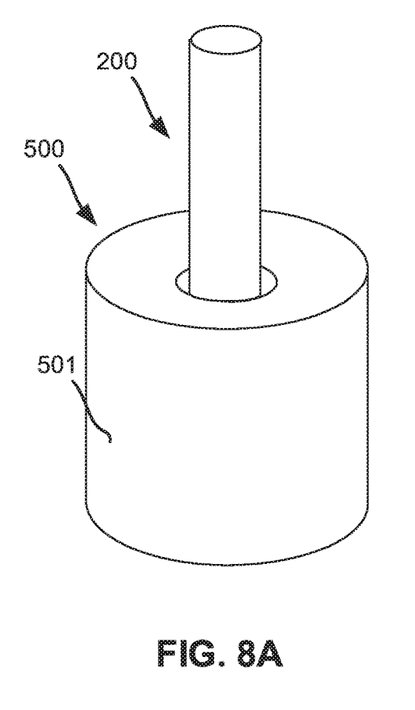
FIGS. 8A and 8B are simplified schematic drawings of a docking station for a stylus.
Figure 8B:
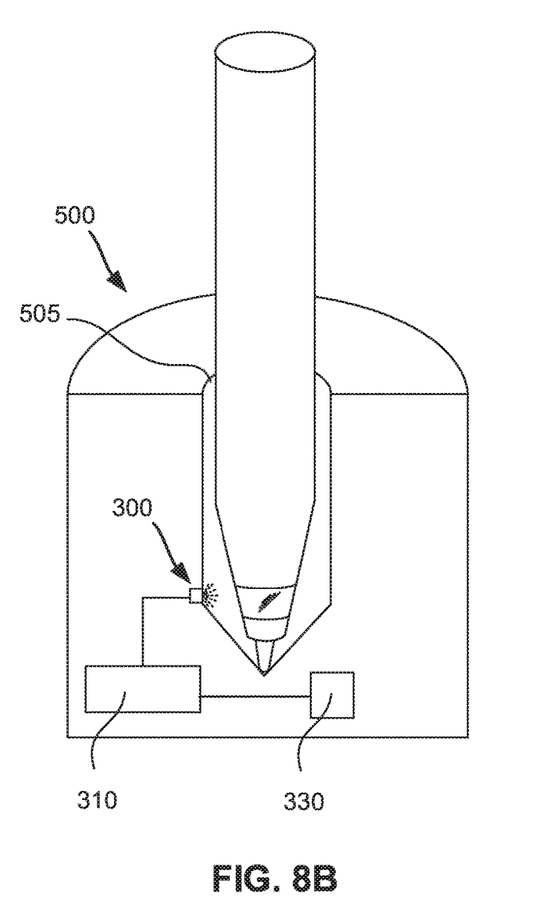

Reference is now made to FIGS. 8A and 8B showing simplified schematic drawings of a docking station for a stylus. In an example implementation, a docking station 500 for stylus 200 includes a housing 501 for supporting stylus 200, a bore 505 for receiving stylus 200, and an LED 300 that provides illumination that is harvested by a light illumination unit included in stylus 200. Docking station 500 also includes a battery 310 that powers illumination of LED 300 or includes tethered connecting to a power source. In some examples, docking station 500 additionally includes a sensor 330 for sensing presence of stylus 200. Sensor 330 may be for example an optical sensor that senses breaking of a line of sight across bore 505 or a contact sensor that senses electrical contact with tip 10.

According to some implementations a stylus includes: a housing extending over a length and including a first end opposite a second end; a circuit configured to generate a signal; a power source configured to power generation of the signal; a writing tip extending from the first end of the housing; and a light harvesting unit configured to generate energy, the light harvesting unit includes: a transparent window integral with the housing and positioned proximal to the writing tip; a panel of solar cells configured to absorb light received through the transparent window; optical fibers configured to transmit light from the window toward the panel of solar cells; and optical diffuser configured to diffuse the light transmitted by the optical fibers over a spatial extent of the panel of solar cells, wherein the energy generated by the light harvesting unit is received by the circuit and configured to recharge the power source.

Optionally, the panel of solar cells is formed from flexible material.

Optionally, the panel of solar cells is positioned on an inner wall of the housing and extends around a circumference of the housing.

Optionally, the panel of solar cells is positioned proximal to the second end of the housing.

Optionally, the optical diffuser is configured to diffuse the light over 360 degrees.

Optionally, the optical diffuser is ring shaped and is configured to fit around the power source.

Optionally, a portion of the optical diffuser is coated with reflective material.

Optionally, the solar panel is configured to absorb light in the range emitted by an electronic display.

Optionally, the solar cells are photovoltaic cells.

Optionally, the energy generated by the light harvesting unit is configured to power generation of the signal.

Optionally, the signal is transmitted at the writing tip.

According to some implementations a method includes: receiving light from an electronic display through a transparent window on a stylus; transmitting the light from the transparent window to an area in the stylus distal from the transparent window with optical fibers, the area including a panel of solar cells; diffusing the light transmitted by the optical fibers over a spatial extent of the panel of solar cells; generating energy from the light absorbed by the solar cells; applying the energy generated to recharge a battery of the stylus; and generating a signal to be transmitted by the stylus with power from the battery.

Optionally, the panel of solar cells is fixed to inner wall of the stylus and extends over a circumference of the stylus.

Optionally, the stylus extends from a first end to a second end and wherein the transparent window is proximal to the first end of the stylus and the panel of solar cells is proximal to the second end of the stylus.

According to some implementations a stylus includes: a housing extending over a length and including a first end opposite a second end, the housing configured to house: a circuit configured to generate a signal; and a power source configured to power generation of the signal; a writing tip extending from the first end of the housing; a shell configured to surround the housing and to define a hollow between the housing and the shell, wherein the shell includes a transparent window positioned proximal to the writing tip; and a panel of solar cells positioned on a surface of the housing that faces the shell, the solar cells configured to absorb light received through the transparent window and generate energy based on the absorbed light; wherein the energy generated by the panel of solar cells is received by the circuit and configured to recharge the power source.

Optionally, the panel of solar cells is aligned with the transparent window.

Optionally, a wall of the shell facing the housing includes reflective material.

Optionally, the transparent window extends 360 degrees around a circumference of the shell.

According to some implementations a docking station for a stylus includes: a housing with a bore configured to receive the stylus; a light emitting diode (LED) housed in the housing and configured to emit light toward a transparent window integrated on the stylus; and a battery configured to power the LED.

Optionally, the docking station includes a sensor configured to detect presence of the stylus.

It is noted that although most of the examples and implementations have been described in reference to a light harvesting unit for a stylus, the light harvesting unit as described may also be integrated with other handheld devices configured for interacting with a touch screen.

Certain features of the examples described herein, which are, for clarity, described in the context of separate embodiments, may also be provided in combination in a single embodiment. Conversely, various features of the examples described herein, which are, for brevity, described in the context of a single embodiment, may also be provided separately or in any suitable sub-combination or as suitable in any other described embodiment of the disclosure. Certain features described in the context of various embodiments are not to be considered essential features of those embodiments, unless the embodiment is inoperative without those elements.

What is claimed is:

1. A stylus comprising:
   a housing extending over a length and including a first end opposite a second end;
   a circuit configured to generate a signal;
   a power source configured to power generation of the signal;
   a writing tip extending from the first end of the housing; and
   a light harvesting unit configured to generate energy, the light harvesting unit comprising:
   at least one transparent window; and
   a panel of solar cells configured to absorb light received through the at least one transparent window, the panel of solar cells positioned on a wall of the housing;
   a shell encompassing the housing, an interior of the shell comprising reflective material that directs light toward the panel of solar cells
   wherein the energy generated by the light harvesting unit is received by the circuit and configured to recharge the power source.

2. The stylus of claim 1, wherein the transparent window is integral with the housing and positioned proximal to the writing tip.

3. The stylus of claim 1, further comprising an optical diffuser configured to diffuse the light transmitted over a spatial extent of the panel of solar cells.

4. The stylus of claim 1, wherein the energy generated by the light harvesting unit is configured to power generation of the signal.

5. The stylus of claim 1, wherein the signal is transmitted at the writing tip.

6. A method comprising:
   receiving light from an electronic display through a transparent window on a stylus;
   enabling the light from the transparent window to be transmitted to an interior of a shell encompassing a housing of the stylus, the interior of the shell comprising reflective material that directs the light toward an area including a panel of solar cells positioned on a wall of the housing;
   generating energy from the light absorbed by the panel of solar cells;
   applying the energy generated to recharge a battery of the stylus; and
   generating a signal to be transmitted by the stylus with power from the battery.

7. The method of claim 6, wherein the panel of solar cells is displaced from the transparent window.

8. A stylus comprising:
   a housing extending over a length and including a first end opposite a second end, the housing configured to house:
   a circuit configured to generate a signal; and
   a power source configured to power generation of the signal;
   a writing tip extending from the first end of the housing;
   a shell configured to surround the housing and to define a hollow between the housing and the shell, wherein the shell includes a transparent window;
   a panel of solar cells configured to absorb light received through the transparent window and generate energy based on the absorbed light;
   a plurality of optical fibers connected to the transparent window, the plurality of optical fibers configured to transfer light received through the transparent window;

wherein the energy generated by the panel of solar cells is received by the circuit and configured to recharge the power source.

9. The stylus of claim 8, wherein the panel of solar cells is aligned with the transparent window.

10. The stylus of claim 8, wherein a wall of the shell facing the housing includes reflective material.

11. The stylus of claim 8, wherein the transparent window extends 360 degrees around a circumference of the shell.

12. The stylus of claim 8, further comprising an optical diffuser configured to diffuse the light transmitted by the optical fibers over a spatial extent of the panel of solar cells.

13. The stylus of claim 12, wherein the optical diffuser is ring shaped and is configured to fit around the power source.

14. The stylus of claim 13, wherein a portion of the optical diffuser is coated with reflective material.

15. A method comprising:
receiving light from an electronic display through a transparent window on a stylus;
enabling the light from the transparent window to be transmitted to a plurality of optical fibers connected to the transparent window, the plurality of optical fibers configured to transfer light received through the transparent window an area including a panel of solar cells positioned on a wall of the housing;
generating energy from the light absorbed by the panel of solar cells;
applying the energy generated to recharge a battery of the stylus; and
generating a signal to be transmitted by the stylus with power from the battery.

16. The method of claim 15, diffusing the light transmitted by the plurality of optical fibers over a spatial extent of the panel of solar cells using an optical diffuser.

17. The method of claim 16, wherein the optical diffuser is ring shaped and is configured to fit around the power source.

18. The method of claim 17, wherein a portion of the optical diffuser is coated with reflective material.

19. The method of claim 15, wherein the panel of solar cells is displaced from the transparent window.

20. The method of claim 15, wherein the transparent window extends 360 degrees around a circumference of the housing.

* * * * *